(12) United States Patent
Li et al.

(10) Patent No.: US 11,401,160 B2
(45) Date of Patent: Aug. 2, 2022

(54) MEMS SENSOR DETECTION DEVICE AND MEMS SENSOR SYSTEM

(71) Applicant: INSTITUTE OF GEOLOGY AND GEOPHYSICS CHINESE ACADEMY OF SCIENCES, Beijing (CN)

(72) Inventors: Zongwei Li, Beijing (CN); Kedu Han, Beijing (CN); Jing Liu, Beijing (CN); Fangfang Feng, Beijing (CN); Changchun Yang, Beijing (CN)

(73) Assignee: INSTITUTE OF GEOLOGY AND GEOPHYSICS CHINESE ACADEMY OF SCIENCES, Beijing (CN)

( * ) Notice: Subject to any disclaimer, the term of this patent is extended or adjusted under 35 U.S.C. 154(b) by 343 days.

(21) Appl. No.: 16/716,272

(22) Filed: Dec. 16, 2019

(65) Prior Publication Data
US 2021/0130164 A1 May 6, 2021

(30) Foreign Application Priority Data

Nov. 6, 2019 (CN) .......................... 201911074905.2

(51) Int. Cl.
*B81B 7/00* (2006.01)
*G01P 15/08* (2006.01)
(Continued)

(52) U.S. Cl.
CPC ............. *B81B 7/008* (2013.01); *G01N 25/56* (2013.01); *G01N 25/60* (2013.01); *G01N 25/68* (2013.01);
(Continued)

(58) Field of Classification Search
CPC ........ G01N 25/56; G01N 25/60; G01N 25/68; G05D 22/02; B81B 7/008; B81B 2201/02;
(Continued)

(56) References Cited

U.S. PATENT DOCUMENTS

| 6,035,694 A * | 3/2000 | Dupuie | G01P 15/125 |
| | | | 73/1.38 |
| 2011/0202225 A1* | 8/2011 | Willis | G01C 25/005 |
| | | | 701/31.4 |
| 2021/0130164 A1* | 5/2021 | Li | B81B 7/008 |

FOREIGN PATENT DOCUMENTS

| CN | 104049109 A | 9/2014 |
| CN | 105634440 A | 6/2016 |

(Continued)

OTHER PUBLICATIONS

Gu Yi, Sun Quan, Qi Min, Qiao Dong-hai, A low noise DAC for high performance MEMS accelerator, Technical Acoustics, vol. 33, No. 4 Pt. 2, Aug. 2014, p. 459-462 p. 4 (Year: 2014).*

(Continued)

*Primary Examiner* — Clayton E. LaBalle
*Assistant Examiner* — Kevin C Butler

(57) ABSTRACT

The invention discloses a MEMS sensor detection device and a MEMS sensor system, wherein the MEMS sensor detection device comprises: a readout circuit used for analog signal processing of the output signal of the MEMS sensor to generate detection voltage; a cancellation voltage generation circuit used for generating a gravity cancellation voltage according to the detection voltage, wherein the gravity cancellation voltage and the gravity acceleration are in a positive proportional relationship; a selection circuit used for selecting the detection voltage output in a feedback phase and selecting the gravity cancellation voltage output in a gravity cancellation phase, wherein in one detection (Continued)

period, the feedback phase is located after the gravity cancellation phase; and a feedback circuit used for generating a feedback voltage according to the output voltage of the selection circuit, wherein the feedback voltage is in a positive proportional relationship with the output voltage of the selection circuit. The MEMS sensor detection device and the MEMS sensor system disclosed by the invention can cancel the influence of gravity acceleration and improve the sensitivity of the MEMS sensor system.

9 Claims, 5 Drawing Sheets

(51) Int. Cl.
| | | |
|---|---|---|
| | *G01P 15/125* | (2006.01) |
| | *G01P 15/13* | (2006.01) |
| | *G01N 25/56* | (2006.01) |
| | *G01N 25/60* | (2006.01) |
| | *G01N 25/68* | (2006.01) |

(52) U.S. Cl.
CPC ............ *G01P 15/08* (2013.01); *G01P 15/125* (2013.01); *G01P 15/131* (2013.01); *B81B 2201/02* (2013.01); *B81B 2207/03* (2013.01)

(58) Field of Classification Search
CPC .... B81B 2207/03; G01P 15/08; G01P 15/125; G01P 15/131
USPC ........................................................ 73/29.01
See application file for complete search history.

(56) References Cited

FOREIGN PATENT DOCUMENTS

| CN | 106526235 A | 3/2017 |
|---|---|---|
| CN | 107085124 A | 8/2017 |
| CN | 206470289 U | 9/2017 |

OTHER PUBLICATIONS

Quan Sun et al., A 10-bit DAC with 2.9 micro-V Low Frequency Noise for High Performance MEMS Capacitive Accelerometer Application, IEEE 11th International Conference on ASIC, Nov. 3-6, 2015, 4 pages (Year: 2015).*

Zongwei, Li et al. Desing of a high preceision digital interface circuit for capacitive MEMS accelerometers with floating point ADC, VLSI Journal, 2017.05.008, pp. 247-254 (Year: 2017).*

Alexander Utz et al., An ultra-low noise capacitance to voltage converter for sensor applications in 0.35 μm CMOS, Journal of Sensors and Sensor Systems, 2017, 17 pages (Year: 2017).*

Yongsang Yoo et al., Review Readout Circuits for Capacitive Sensors, Micromachines 2021, 12, 960 (MDPI), https://www.mdpi.com/journal/micromachines, 2021, 30 pages (Year: 2021).*

Mme Lavinia-Elena Ciotirca, Theses Micro Nano Systemes, Universite de Toulouse,L 23, May 2017, 180 pages (Year: 2017).*

First Office Action issued by CINPA dated May 22, 2020 in connection with the corresponding Chinese patent application.

Gu Yi et al., "Low Noise DAC Applied to High Performance MEMS Accelerometers", Acoustic Technology, vol. 33, No. 4, Aug. 2014.

* cited by examiner

MEMS SENSOR DETECTION DEVICE AND MEMS SENSOR SYSTEM

FIELD OF THE INVENTION

The invention relates to the technical field of micro-electromechanical systems, in particular to a MEMS sensor detection device and a MEMS sensor system.

BACKGROUND OF THE INVENTION

With further development of artificial intelligence, automatic driving, inertial navigation and Internet of Things, signal detection is particularly important, and the sensor technology which is closely related to signal detection has been rapidly developed. Especially with the development of Internet of Things, the demand of sensor products has increased greatly, and the focus has gradually turned to the high technical content field of MEMS (Micro-Electro-Mechanical Systems) sensors. Micro-electro-mechanical system is a micro-device or system which uses traditional semiconductor technology and materials, integrates micro-sensor, micro-actuator, micro-mechanical mechanism, signal processing and control circuit, high performance electronic integrated device, interface, communication and power supply, and has the advantages of small size, low cost, integration and so on.

FIG. 1 is a circuit schematic of a conventional MEMS sensor system employing an analog closed loop negative feedback structure including a MEMS sensor 10 and a detection device of the MEMS sensor 10, wherein the detection device includes a readout circuit 11, a feedback circuit 12, and a switch S11. Specifically, the MEMS sensor 10 is a capacitive MEMS acceleration sensor and is used for converting acceleration into weak signal output; the readout circuit 11 is used for analog signal processing such as amplification, filtering and the like of the output signal of the MEMS sensor 10 to generate detection voltage $V_S$; the switch S11 is conducted when the detection device works in a feedback phase, and transmits the detection voltage $V_S$ to the feedback circuit 12; the feedback circuit 12 is used for generating a feedback voltage $V_F$ proportional to the detection voltage $V_S$ according to the detection voltage $V_S$ so as to provide a feedback electrostatic force to the MEMS sensor 10, wherein the feedback electrostatic force enables the proof mass in the MEMS sensor 10 to always maintain a small-range displacement around an equilibrium location.

Sensitivity refers to the ratio of the detection directional output variation to the input variation when the sensor system is operating stably. For the MEMS sensor system shown in FIG. 1, assuming the acceleration range detected by the MEMS sensor 10 is ±2 g and the sensitivity is 2V/g, and assuming that the maximum output voltage of the readout circuit is 4V, the maximum voltage value of the detection voltage $V_S$ is 4V, where g is the gravity acceleration. If the sensitivity of the MEMS sensor system is to be improved to 4 V/g, the acceleration range detected by the MEMS sensor 10 is reduced to ±1 g without changing the maximum voltage value of the detection voltage $V_S$. At this situation, the MEMS sensor 10 cannot normally operate at the 1 g or-1 g location because acceleration signals larger than 1 g cannot be detected at the 1 g location and acceleration signals smaller than −1 g cannot be detected at the −1 g location. Thus, there is a contradiction between detection acceleration range and high sensitivity in the MEMS sensor system shown in FIG. 1. In seismic exploration and other applications, high precision and high sensitivity MEMS sensor systems are required, and the sensitivity of the MEMS sensor system shown in FIG. 1 cannot meet the requirements.

SUMMARY OF THE INVENTION

The invention aims to solve the problem of low sensitivity of the existing MEMS sensor system.

The invention is realized by the following technical solution:

a MEMS sensor detection device, which comprises:

a readout circuit used for analog signal processing of the output signal of the MEMS sensor to generate detection voltage;

a cancellation voltage generation circuit used for generating a gravity cancellation voltage according to the detection voltage, wherein the gravity cancellation voltage is positive proportional to the gravity acceleration;

a selection circuit used for selecting the detection voltage output in a feedback phase and selecting the gravity cancellation voltage output in a gravity cancellation phase, wherein in one detection period, the feedback phase is located after the gravity cancellation phase; and a feedback circuit used for generating a feedback voltage according to the output voltage of the selection circuit, wherein the feedback voltage is positive proportional to the output voltage of the selection circuit.

Optionally, the cancellation voltage generation circuit includes:

a first low-pass filter used for low-pass filtering processing of the detection voltage to generate the gravity cancellation voltage.

Optionally, the cancellation voltage generation circuit includes:

a second low-pass filter used for low-pass filtering processing of the detection voltage to generate a filtered voltage;

a pulse generator used for generating a positive pulse when the filtered voltage exceeds a preset positive voltage and generating a negative pulse when the filtered voltage exceeds a preset negative voltage;

a counter used for counting pulses generated by the pulse generator within a preset time interval, adding 1 when the positive pulse is received, and subtracting 1 when the negative pulse is received;

a register used for storing the counting value of the counter;

a first digital-to-analog converter used for digital-to-analog conversion processing of the count value stored in the register so as to generate the gravity cancellation voltage.

Optionally, the cancellation voltage generation circuit includes:

a first analog-to-digital converter used for performing analog-to-digital conversion on the detection voltage so as to generate a digital signal corresponding to the detection voltage;

a first processing circuit used for generating a digital signal corresponding to the gravity cancellation voltage according to the digital signal corresponding to the detection voltage; and a second digital-to-analog converter used for digital-to-analog conversion processing of the digital signal corresponding to the gravity cancellation voltage so as to generate the gravity cancellation voltage.

Optionally, the digital signal corresponding to the gravity cancellation voltage is an average value of the digital signal corresponding to the detection voltage within a preset time interval.

Optionally, the selection circuit comprises a first switch and a second switch;

one end of the first switch is used for receiving the detection voltage, one end of the second switch is used for receiving the gravity cancellation voltage, and the other end of the first switch is connected with the other end of the second switch and serves as an output end of the selection circuit.

Optionally, the MEMS sensor detection device further comprises:

a detection voltage output end used for outputting the detection voltage;

a cancellation voltage output end used for outputting the gravity cancellation voltage.

Optionally, the MEMS sensor detection device further comprises:

a second analog-to-digital converter used for performing analog-to-digital conversion on the detection voltage so as to generate a digital signal corresponding to the detection voltage;

a third analog-to-digital converter used for performing analog-to-digital conversion on the gravity cancellation voltage so as to generate a digital signal corresponding to the gravity cancellation voltage; and a second processing circuit used for digital signal processing of the digital signal corresponding to the detection voltage and the digital signal corresponding to the gravity cancellation voltage.

Based on the same inventive concept, the invention further provides a MEMS sensor system which comprises the MEMS sensor and further the above MEMS sensor detection device.

Optionally, the MEMS sensor is a three-electrode MEMS sensor;

in a detection period, the end of the gravity cancellation phase is the start of the feedback phase, and the end of the feedback phase is the start of the readout phase.

Optionally, the MEMS sensor is a five-electrode MEMS sensor;

In a detection period, the start of the gravity cancellation phase is the start of the readout phase, the end of the gravity cancellation phase is the start of the feedback phase, and the end of the feedback phase is the end of the readout phase.

Optionally, the duration of the gravity cancellation phase is longer than the duration of the feedback phase.

Compared with the prior art, the invention has the following advantages and beneficial effects:

According to the MEMS sensor detection device and the MEMS sensor system provided by the invention, a cancellation voltage generation circuit is arranged in the MEMS sensor detection device by adopting a time-multiplexed and gravity cancellation technology, and the cancellation voltage generation circuit generates a gravity cancellation voltage which is in a positive proportion relation with gravity acceleration according to the detection voltage, so that the influence of the gravity acceleration is cancelled, and the MEMS sensor system can realize high sensitivity.

BRIEF DESCRIPTION OF THE DRAWINGS

The accompanying drawings, which are included to provide a further understanding of embodiments of the invention and are incorporated in and constitute a part of this application, are not intended to limit the embodiments of the invention. In the drawings.

DETAILED DESCRIPTION OF THE INVENTION

Figure 1:
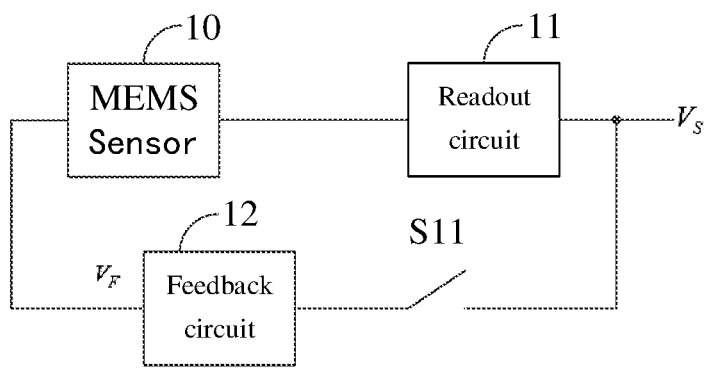
FIG. 1 is a circuit schematic of a conventional MEMS sensor system.
Figure 2:
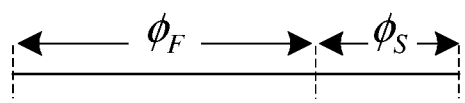
FIG. 2 is a timing diagram of the operation of a prior art three-electrode MEMS sensor system.
Figure 3:
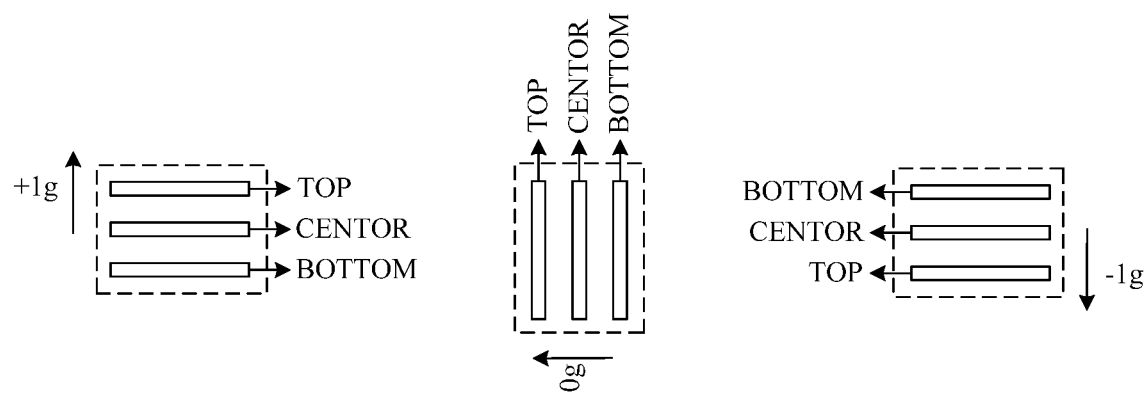
FIG. 3 is a schematic illustration of a three-electrode MEMS sensor operating at +1 g, 0 g, and −1 g locations.

As described in the background, the application sensitivity of the MEMS sensor system shown in FIG. 1 is not satisfactory. Taking the MEMS sensor 10 as a three-electrode MEMS sensor as an example, FIG. 2 is a timing chart of the operation of the MEMS sensor system, in which $\phi_F$ is the duration of the operation of the MEMS sensor system in the feedback phase and $\phi_S$ is the duration of the operation of the MEMS sensor system in the readout phase, i.e. within one detection period, the end of the feedback phase is the start of the readout phase. FIG. 3 is a schematic diagram of the MEMS sensor 10 operating at the +1 g, 0 g, and −1 g locations with the maximum input acceleration of the MEMS sensor system limited by the maximum output voltage of the readout circuit as follows:

$$A_{max} = \phi_F \times \frac{F_F}{m}, F_F = k_1 \times V_s$$

Wherein, $A_{max}$ is the maximum input acceleration, $\phi_F$ is the duration of the feedback phase, $F_F$ is the feedback electrostatic force, m is the value of a proof mass in the MEMS sensor 10, $k_1$ is the proportional coefficient related to the electrode parameter and the reference voltage in the MEMS sensor 10, and $V_S$ is the detection voltage. $|A_{max}|>1$ g must be met if the MEMS sensor 10 is operable at locations of 0 g, 1 g, and −1 g. If the range of the MEMS sensor 10 is ±0.5 g, $|A_{max}|\geq 1.5$ g must be met. Assuming that the full range of the detection voltage $V_S$ is 3V, then the sensitivity is 2V/g when $|A_{max}|=1.5$ g. On that basis, the present invention provides a MEMS sensor system and a MEMS sensor detection device, gravity cancellation is carried out by adopting a time-multiplexed technology, and the sensitivity of the MEMS sensor system can be effectively improved.

In order that the objects, technical solutions and advantages of the present invention may be more clearly understood, the present invention will be described in further detail with reference to the following examples and accompanying drawings, in which illustrative embodiments of the invention and descriptions thereof are given by way of illustration only, and not by way of limitation.

Figure 4:
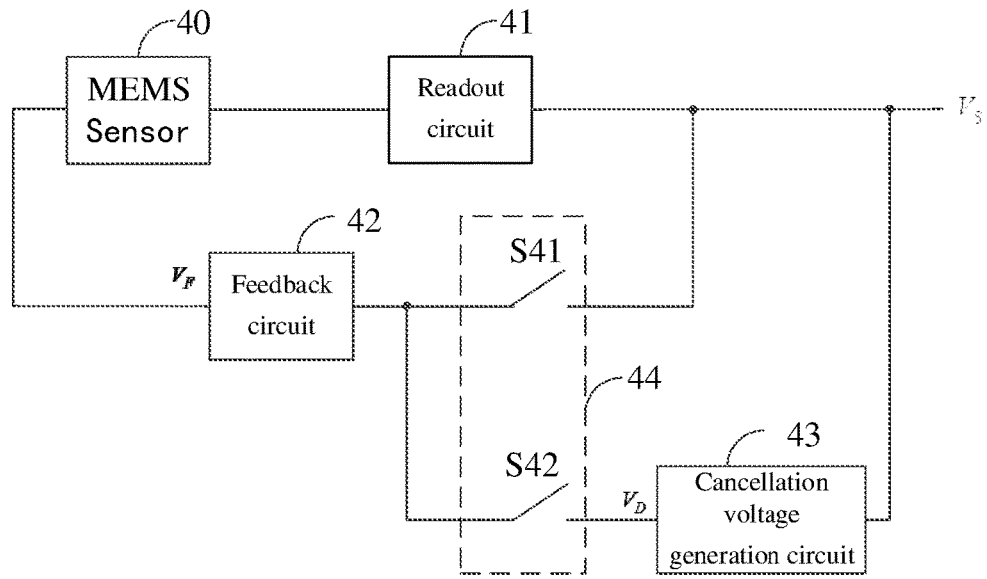
FIG. 4 is a circuit schematic of a MEMS sensor system according to an embodiment of the present invention.

The embodiment provides a MEMS sensor system and a MEMS sensor detection device, and FIG. 4 is a circuit structure schematic diagram of the MEMS sensor system. The MEMS sensor system comprises a MEMS sensor 40 and the MEMS sensor detection device comprising a readout circuit 41, a feedback circuit 42, cancellation voltage generating circuit 43 and a selection circuit 44.

Specifically, the MEMS sensor 40 is a capacitive MEMS acceleration sensor for converting acceleration into a weak electrical signal output. In a capacitive MEMS acceleration sensor, the movable proof mass forms a movable electrode of the variable capacitance. When the proof mass is displaced by the acceleration, the capacitance formed between the fixed electrode and the movable electrode changes, and the magnitude of the acceleration can be measured by the detection device.

The readout circuit 41 is used for processing analog signal of the output signal of the MEMS sensor 40 to generate a detection voltage $V_S$. The readout circuit 41 generally comprises a front-end amplifier and a signal conditioning circuit, wherein the front-end amplifier is composed of an operational amplifier and some other components and is used for amplifying an output signal of the MEMS sensor 40, and the front-end amplifier can be a correlated double-sampling circuit or an auto-zero circuit and the like; the signal conditioning circuit is also composed of an operational amplifier and some other components for filtering the output signal of the front-end amplifier or the like, and can be a proportional differentiator, an integrator or a proportional differential integrator or the like.

The cancellation voltage generation circuit 43 is used for generating a gravity cancellation voltage $V_D$ according to the detection voltage $V_S$, and the gravity cancellation voltage $V_D$ and the gravity acceleration are in a positive proportional relationship.

Figure 5:
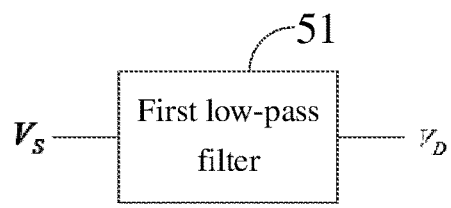
FIG. 5 is a circuit schematic of a cancellation voltage generation circuit according to an embodiment of the present invention.

FIG. 5 is a circuit schematic diagram of the cancellation voltage generation circuit 43 including a first low-pass filter 51. The first low-pass filter 51 is used for performing low-pass filtering processing on the detection voltage $V_S$ to generate the gravity cancellation voltage $V_D$, that is, an input end of the first low-pass filter 51 is used for receiving the detection voltage $V_S$, and an output end of the first low-pass filter 51 is used for outputting the gravity cancellation voltage $V_D$.

Figure 6:
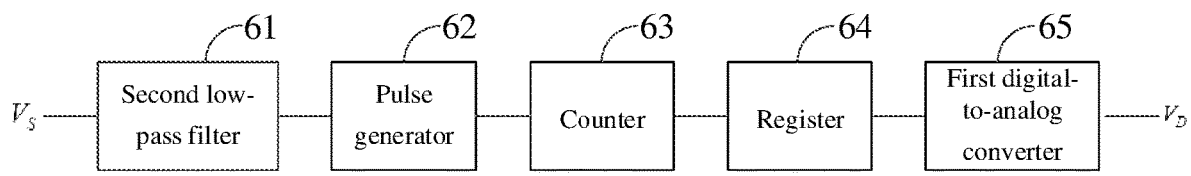
FIG. 6 is a circuit diagram of a cancellation voltage generation circuit according to another embodiment of the present invention.

FIG. 6 is a schematic diagram of another circuit configuration of the cancellation voltage generation circuit 43 including a second low-pass filter 61, a pulse generator 62, a counter 63, a register 64, and a first digital-to-analog converter 65.

Figure 7:
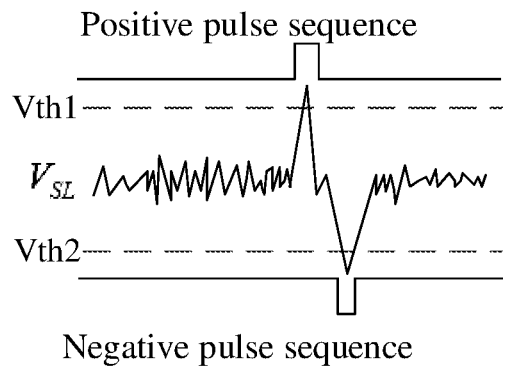
FIG. 7 is a schematic diagram of a pulse generator generating positive and negative pulses according to an embodiment of the present invention.

Specifically, the second low-pass filter 61 is used for low-pass filtering of the detection voltage $V_S$ to generate a filtered voltage. The pulse generator 62 is used for generating a positive pulse when the filtered voltage exceeds a preset positive voltage and generating a negative pulse when the filtered voltage exceeds a preset negative voltage. FIG. 7 is a schematic diagram of the pulse generator 62 generating positive and negative pulses, wherein $V_{SL}$ is the filtered voltage, Vth1 is the preset positive voltage, and Vth2 is the preset negative voltage. The counter 63 is used for counting pulses generated by the pulse generator 62 within a preset time interval, increasing the count by 1 when the positive pulse is received, and decreasing the count by 1 when the negative pulse is received. The register 64 is used for storing the count value of the counter 63, and the first digital-to-analog converter 65 is used for performing digital-to-analog conversion processing on the count value stored in the register 64 so as to generate the gravity cancellation voltage $V_D$.

The voltage value of the preset positive voltage can be determined according to the voltage value output when the MEMS sensor 40 works at the 1 g location: the larger the voltage value output when the MEMS sensor 40 operates at the 1 g location, the larger the voltage value of the preset positive voltage is set, otherwise the smaller the voltage value of the preset positive voltage is set. Correspondingly, the voltage value of the preset negative voltage can be determined according to the voltage value output when the MEMS sensor 40 works at the location of −1 g: the larger the voltage value output by the MEMS sensor 40 when operating at the −1 g location, the larger the voltage value of the preset negative voltage is set, otherwise the smaller the voltage value of the preset negative voltage is set. Further, the voltage value of the preset positive voltage and the voltage value of the preset negative voltage can also be adjusted according to the time duration of the gravity cancellation phase: the shorter the duration of the gravity cancellation phase is set, the larger the voltage value of the preset positive voltage and the absolute voltage value of the preset negative voltage can be set, otherwise the smaller the voltage value of the preset positive voltage and the absolute voltage value of the preset negative voltage can be set. The length of the preset time interval is determined by the frequency characteristic of the detected physical quantity: the higher the frequency of the detected physical quantity, the shorter the preset time interval can be set, otherwise the longer the preset time interval can be set, the commonly used time intervals are 0.5 s, 1 s, 2 s, etc.

Figure 8:
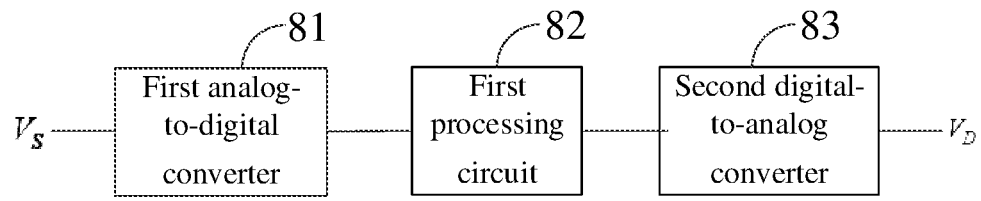
FIG. 8 is a circuit schematic of a cancellation voltage generation circuit according to yet another embodiment of the present invention.

FIG. 8 is a schematic diagram of yet another circuit configuration of the cancellation voltage generation circuit 43 including a first analog-to-digital converter 81, a first processing circuit 82, and a second digital-to-analog converter 83.

Figure 9:
FIG. 9 is a schematic diagram of a detection voltage versus a gravity cancellation voltage according to an embodiment of the present invention.

Specifically, the first analog-to-digital converter 81 performs analog-to-digital conversion on the detection voltage $V_S$ to generate a digital signal corresponding to the detection voltage $V_S$. The first processing circuit 82 is used for generating a digital signal corresponding to the gravity cancellation voltage $V_D$ according to the digital signal corresponding to the detection voltage $V_S$, and in the embodiment of the invention, the digital signal corresponding to the gravity cancellation voltage $V_D$ is the average value of the digital signal corresponding to the detection voltage $V_S$ within a preset time interval, i.e.

$$V_{DD} = \frac{1}{N}\sum_{i=1}^{N} V_{SDi},$$

wherein $V_{DD}$ is the digital signal corresponding to the gravity cancellation voltage $V_D$, N is the number of the detection voltages $V_S$ detected within the preset time interval; and $V_{SDi}$ is a digital signal corresponding to the id, detection voltage $V_S$. The length of the preset time interval can be set according to actual requirements as long as the number of the detection voltages $V_S$ acquired in the preset time interval is guaranteed to be more than two. And the second digital-to-analog converter 83 is used for performing digital-to-analog conversion processing on a digital signal corresponding to the gravity cancellation voltage $V_D$ so as to generate the gravity cancellation voltage $V_D$, and the relation diagram of the detection voltage $V_S$ and the gravity cancellation voltage $V_D$ is as shown in FIG. 9. The first processing circuit 82 may be a processing circuit such as a DSP, an FPGA or an MCU, and it is to be noted that the first processing circuit 82 is not limited to calculate an average value of a digital signal corresponding to the detection voltage $V_S$ within the preset time interval, the average value of the digital signal corresponding to the detection voltage $V_S$ within the preset time interval is taken as a digital signal corresponding to the gravity cancellation voltage $V_D$, and the first processing circuit 82 may perform other calculations as long as the gravity cancellation voltage $V_D$ generated according to the detection voltage $V_S$ is in a positive proportional relation with the gravity acceleration. The length of the preset time interval is determined by the frequency characteristic of the detected physical quantity: the higher the frequency of the detected physical quantity, the shorter the preset time interval can be set, otherwise the longer the preset time interval can be set, the commonly used time intervals are 0.5 s, 1 s, 2 s, etc.

The selection circuit 44 is configured to select the detection voltage $V_S$ output during a feedback phase and the gravity cancellation voltage $V_D$ output is selected during a gravity cancellation phase, wherein the feedback phase is located after the gravity cancellation phase during a detection period. In an embodiment of the invention, the selection circuit 44 comprises a first switch S41 and a second switch S42. One end of the first switch S41 is used for receiving the detection voltage $V_S$, one end of the second switch S42 is used for receiving the gravity cancellation voltage $V_D$, and the other end of the first switch S41 is connected to the other end of the second switch S42 and serves as an output end of the selection circuit 44. Further, the turn on and off of the first switch S41 is determined by a control signal received at a control terminal of the first switch S41, and the turn on and off of the second switch S42 is determined by a control signal received at a control terminal of the second switch S42. In the feedback phase, the first switch S41 is turned on, the second switch S42 is turned off, and the selection circuit 44 outputs the detection voltage $V_S$; during the gravity cancellation phase, the first switch S41 is turned off, the second switch S42 is turned on, and the selection circuit 44 outputs a gravity cancellation voltage $V_D$. The first switch S41 and the second switch S42 may be a PMOS transistor, an NMOS transistor, a CMOS switch circuit or the like, which is not limited by the embodiment of the present invention.

The feedback circuit 42 is configured to generate a feedback voltage $V_F$ based on an output voltage of the selection circuit 44, with the feedback voltage $V_F$ being proportional to an output voltage of the selection circuit 44. By generating the feedback voltage $V_F$, a feedback electrostatic force can be provided to the MEMS sensor 40 that keeps the proof mass in the MEMS sensor 40 constantly at an equilibrium location for a small range of displacement. The particular circuit configuration of the feedback circuit 42 is not an improvement over the embodiments of the present invention, which may employ existing feedback circuit configurations and will not be described in detail.

Figure 10:
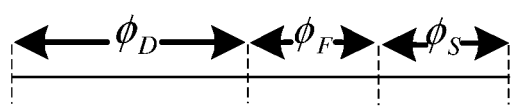
FIG. 10 is a timing diagram of the operation of a three-electrode MEMS sensor system according to an embodiment of the present invention.

Taking the MEMS sensor 40 as a three-electrode MEMS sensor as an example, FIG. 10 is a timing diagram of the operation of a three-electrode MEMS sensor system in which $\phi_S$ is the duration of the MEMS sensor system operating in the feedback phase, $\phi_S$ is the duration of the MEMS sensor system operating in the readout phase, and $\phi_S$ is the duration of the MEMS sensor system operating in the gravity cancellation phase. During a detection period, the end of the gravity cancellation phase is the start of the feedback phase, and the end of the feedback phase is the start of the readout phase.

According to the MEMS sensor detection device and the MEMS sensor system provided by the embodiment of the invention, after the gravity cancellation technology is adopted, under the limit of the maximum output voltage of the readout circuit, the maximum input acceleration of the system is as follows:

$$A'_{max} = \phi_F \frac{F_F}{m} + \phi_D \frac{F_D}{m}, F_F = k_1 V_S, F_D = k_2 V_D$$

Wherein $A'_{max}$ is the maximum input acceleration, $\phi_F$ is the duration of the feedback phase, $\phi_D$ is the duration of the gravity cancellation phase, m is the value of the proof mass in the MEMS sensor 40, $k_1$ and $k_2$ are a scale factor related to electrode parameters and reference voltages in the MEMS sensor 10. If the range of the MEMS sensor 40 is ±0.5 g, then $|A'_{max}| \geq 1.5$ g Assuming that the full range of the detection voltage $V_S$ is 3V, when $|A'_{max}|=1.5$ g, due to the adoption of the gravity cancellation technology, the maximum acceleration allowed by the system corresponding to the output full range voltage is 0.5 g, and at the time, the sensitivity is 6V/g, which is 3 times higher than that of the prior art. Therefore, the embodiment of the invention adopts a time-multiplexed technology to perform gravity cancellation, and can effectively improve the sensitivity of the MEMS sensor system.

Figure 11:
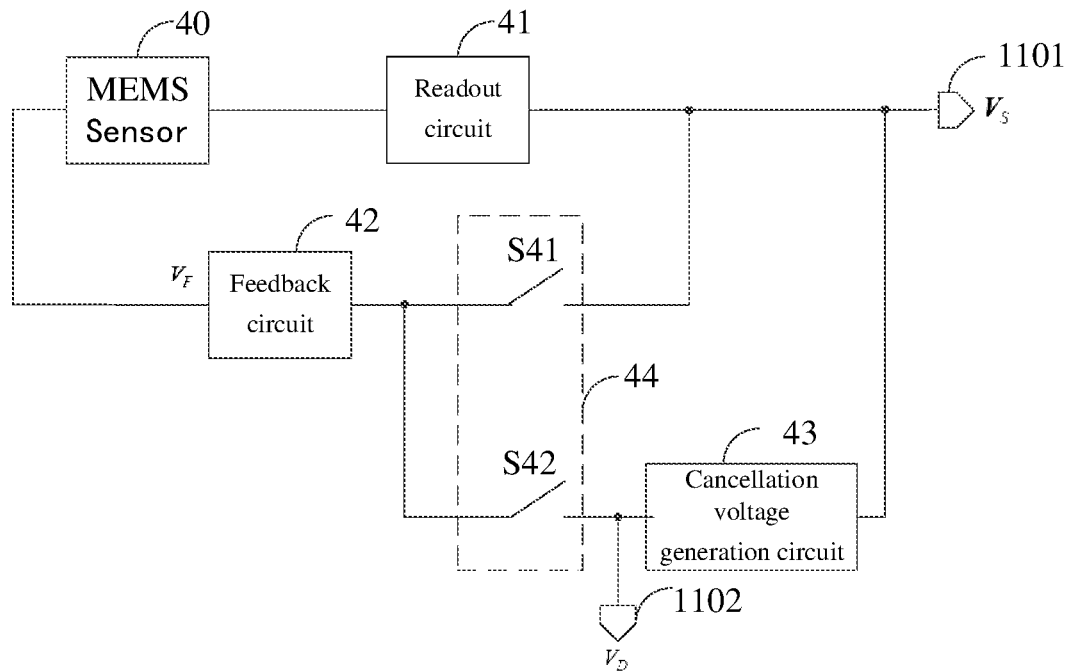
FIG. 11 is a circuit schematic of a MEMS sensor system according to another embodiment of the present invention.

Referring to FIG. 11, in an alternative implementation, the MEMS sensor detection device may include a cancellation voltage output 1102 in addition to providing a detection voltage output 1101. The detection voltage output end 1101 is used for outputting the detection voltage $V_S$, and the cancellation voltage output end 1102 is used for outputting the gravity cancellation voltage $V_D$. At this time, the acceleration signal output by the system is as follows:

$$A_{DC+AC} \propto \frac{\phi_D}{\phi_F} V_D + V_s$$

$A_{DC+AC}$ represents the acceleration DC component and AC component of the system output when the accelerometer is operating at any position, and information such as the inclination angle can be provided while the acceleration signal is measured. By providing the cancellation voltage output 1102, an additional observation can be provided that approximates the average output of the detection voltage $V_S$ in a statistical sense over a period of time, and the detection voltage $V_S$ can be corrected.

Figure 12:
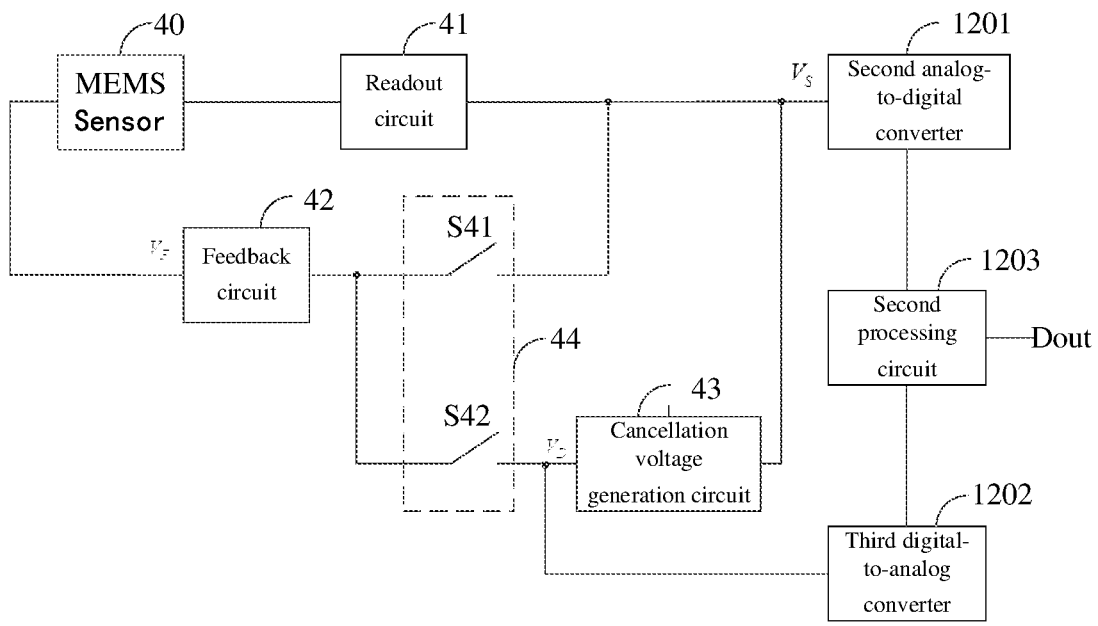
FIG. 12 is a circuit schematic of a MEMS sensor system according to yet another embodiment of the present invention.

Referring to FIG. 12, in an alternative implementation, the MEMS sensor detection device may further include a second analog-to-digital converter 1201, a third analog-to-digital converter 1202, and a second processing circuit 1203. The second analog-to-digital converter 1201 is used for performing analog-to-digital conversion on the detection voltage $V_S$ to generate a digital signal corresponding to the detection voltage $V_S$; the third analog-to-digital converter 1202 is used for performing analog-to-digital conversion on the gravity cancellation voltage $V_D$ so as to generate a digital signal corresponding to the gravity cancellation voltage $V_D$; the second processing circuit 1203 is used for performing digital signal processing on the digital signal corresponding to the detection voltage $V_S$ and the digital signal corresponding to the gravity cancellation voltage $V_D$ and outputting a digital signal Dout. Further, the second processing circuit 1203 may be a processing circuit such as a DSP, FPGA or MCU.

By adopting the analog-digital converter to convert the detection voltage $V_S$ and the gravity cancellation voltage $V_D$ into digital signals, and processing the digital signals corresponding to the detection voltage $V_S$ and the digital signals corresponding to the gravity cancellation voltage $V_D$ to output the digital signals Dout, the adaptability of the digital circuits of the system can be enhanced, and the use range of the MEMS sensor is expanded. Meanwhile, more digital signal processing technologies can be used to further improve the performance of the system such as accuracy, noise, temperature drift, zero drift and the like, and the purpose of greatly improving the performance of the system is achieved. What kind of processing is specifically performed by the second processing circuit 1203 is set according to actual requirements, and this is not limited by the embodiment of the present invention.

Figure 13:
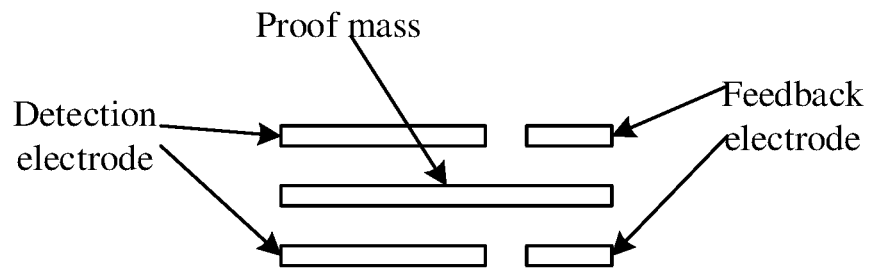
FIG. 13 is a schematic diagram of the structure of a five-electrode MEMS sensor.
Figure 14:
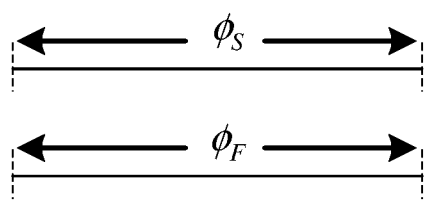
FIG. 14 is a timing diagram of the operation of a prior art five-electrode MEMS sensor system.

For a five-electrode real-time feedback MEMS sensor, if the MEMS sensor can normally work at any angle smaller than 1 g, the gravity cancellation technology provided by the embodiment of the invention is also applicable. FIG. 13 is a schematic view showing the structure of a five-electrode MEMS sensor, and FIG. 14 is a timing chart showing the operation of a conventional five-electrode MEMS sensor system in which $\phi_F$ is the duration of the five-electrode MEMS sensor system operating in the feedback phase, and $\phi_S$ is the duration of the five-electrode MEMS sensor system operating in the readout phase. Since the detection electrode and the feedback electrode of the five-electrode MEMS sensor are independent of each other, the feedback phase and the readout phase of the five-electrode MEMS sensor are operated in parallel. The gravity cancellation technology provided by the embodiment of the invention is applied to a five-electrode MEMS sensor, and a time-multiplexed technology is introduced into a feedback time sequence to realize gravity cancellation.

Figure 15:
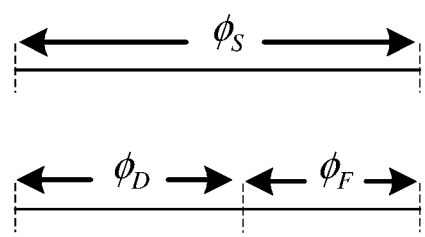
FIG. 15 is a timing diagram of the operation of a five-electrode MEMS sensor system according to an embodiment of the present invention.

Taking the MEMS sensor 40 as a five-electrode MEMS sensor as an example, FIG. 15 is a timing diagram of the operation of a five-electrode MEMS sensor system according to an embodiment of the present invention, wherein $\phi_F$ is the duration of the MEMS sensor system operating in the feedback phase, $\phi_S$ is the length of time the MEMS sensor system is operating in the readout phase, and $\phi_D$ is the length of time the MEMS sensor system is operating in the gravity cancellation phase. In a detection period, the start of the gravity cancellation phase is the start of the readout phase, the end of the gravity cancellation phase is the start of the feedback phase, and the end of the feedback phase is the end of the readout phase.

Regardless of whether the gravity cancellation technique provided by the embodiment of the present invention is a MEMS sensor applied to three-electrode feedback or a MEMS sensor applied to five-electrode real-time feedback, generally, the duration of the gravity cancellation phase is longer than the duration of the feedback phase, and further, the duration of the gravity cancellation phase can be set to be more than twice the duration of the feedback phase. However, embodiments of the present invention do not limit the specific value of the duration of the gravity cancellation phase, as long as gravity cancellation is achieved within the duration of the gravity cancellation phase.

The above-described embodiments, objects, technical solutions, and advantages of the present invention have been described in further detail, and it is to be understood that the above-described embodiments are merely illustrative of the present invention and are not intended to limit the scope of the present invention, but on the contrary, the intention is to cover any modifications, equivalents, improvements, etc., falling within the spirit and scope of the invention.

The invention claimed is:

1. A MEMS sensor detection device, characterized by comprising:

a readout circuit used for analog signal processing of the output signal of the MEMS sensor to generate detection voltage;

a cancellation voltage generation circuit used for generating a gravity cancellation voltage according to the detection voltage, wherein the gravity cancellation voltage and the gravity acceleration are in a positive proportional relationship;

a selection circuit used for selecting the detection voltage output in a feedback phase and selecting the gravity cancellation voltage output in a gravity cancellation phase, wherein in one detection period, the feedback phase is located after the gravity cancellation phase; and a feedback circuit used for generating a feedback voltage according to the output voltage of the selection circuit, wherein the feedback voltage is in a positive proportional relationship with the output voltage of the selection circuit;

the cancellation voltage generation circuit comprises:

a first low-pass filter used for low-pass filtering processing of the detection voltage to generate the gravity cancellation voltage;

a second low-pass filter used for low-pass filtering processing of the detection voltage to generate a filtered voltage;

a pulse generator used for generating a positive pulse when the filtered voltage exceeds a preset positive voltage and generating a negative pulse when the filtered voltage exceeds a preset negative voltage;

a counter used for counting pulses generated by the pulse generator within a preset time interval, adding 1 when the positive pulse is received, and subtracting 1 when the negative pulse is received;

a register used for storing the counting value of the counter;

a first digital-to-analog converter used for digital-to-analog conversion processing of the count value stored in the register so as to generate the gravity cancellation voltage.

2. The MEMS sensor detection device of claim 1, characterized in that the cancellation voltage generation circuit comprises:
- a first analog-to-digital converter used for performing analog-to-digital conversion on the detection voltage so as to generate a digital signal corresponding to the detection voltage;
- a first processing circuit used for generating a digital signal corresponding to the gravity cancellation voltage according to the digital signal corresponding to the detection voltage; and
- a second digital-to-analog converter used for digital-to-analog conversion processing of the digital signal corresponding to the gravity cancellation voltage so as to generate the gravity cancellation voltage.

3. The MEMS sensor detection device of claim 2, characterized in that the digital signal corresponding to the gravity cancellation voltage being an average value of the digital signal corresponding to the detection voltage within a preset time interval.

4. The MEMS sensor detection device of claim 1, characterized by further comprising:
- a detection voltage output end used for outputting the detection voltage;
- a cancellation voltage output end used for outputting the gravity cancellation voltage.

5. The MEMS sensor detection device of claim 1, characterized by further comprising:
- a second analog-to-digital converter used for performing analog-to-digital conversion on the detection voltage so as to generate a digital signal corresponding to the detection voltage;
- a third analog-to-digital converter used for performing analog-to-digital conversion on the gravity cancellation voltage so as to generate a digital signal corresponding to the gravity cancellation voltage; and
- a second processing circuit used for digital signal processing of the digital signal corresponding to the detection voltage and the digital signal corresponding to the gravity cancellation voltage.

6. A MEMS sensor system, comprising a MEMS sensor, characterized by further comprising a MEMS sensor detection device according to claim 1.

7. The MEMS sensor system of claim 6, characterized in that the MEMS sensor being a three-electrode MEMS sensor;
in a detection period, the end of the gravity cancellation phase being the start of the feedback phase, and the end of the feedback phase being the start of the readout phase.

8. The MEMS sensor system of claim 6, characterized in that the MEMS sensor being a five-electrode MEMS sensor;
in a detection period, the start of the gravity cancellation phase being the start of the readout phase, the end of the gravity cancellation phase being the start of the feedback phase, and the end of the feedback phase being the end of the readout phase.

9. The MEMS sensor system of claim 8, characterized in that the time of the gravity cancellation phase being longer than the duration of the feedback phase.

* * * * *